(12) United States Patent
Faneuf et al.

(10) Patent No.: US 7,149,086 B2
(45) Date of Patent: Dec. 12, 2006

(54) SYSTEMS TO COOL MULTIPLE ELECTRICAL COMPONENTS

(75) Inventors: Barrett Faneuf, Olympia, WA (US); Tomm Aldridge, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 11/009,173

(22) Filed: Dec. 10, 2004

(65) Prior Publication Data

US 2006/0126294 A1 Jun. 15, 2006

(51) Int. Cl.
*H05K 7/20* (2006.01)
(52) U.S. Cl. ............... 361/699; 361/700; 361/719; 361/721; 257/714; 165/80.4; 165/80.5; 165/104.33
(58) Field of Classification Search ........ 361/697–701, 361/704–709, 720, 749; 165/104.21, 80.3, 165/104.26, 104.33, 104.14, 104.19, 104.32; 174/15.2, 16.3; 257/714–715, 690, 777, 257/778, 730
See application file for complete search history.

(56) References Cited

U.S. PATENT DOCUMENTS

| | | | | | |
|---|---|---|---|---|---|
| 4,939,624 | A | * | 7/1990 | August et al. .............. 361/816 |
| 5,159,529 | A | * | 10/1992 | Lovgren et al. ............ 361/699 |
| 5,343,359 | A | * | 8/1994 | Morton et al. .............. 361/707 |
| 5,424,916 | A | * | 6/1995 | Martin ....................... 361/698 |
| 5,504,924 | A | * | 4/1996 | Ohashi et al. .............. 361/676 |
| 6,055,157 | A | * | 4/2000 | Bartilson ..................... 361/699 |
| 6,062,299 | A | * | 5/2000 | Choo et al. .................. 165/46 |
| 6,073,683 | A | * | 6/2000 | Osakabe et al. ....... 165/104.33 |
| 6,148,905 | A | * | 11/2000 | Sehmbey ............... 165/104.21 |
| 6,191,945 | B1 | * | 2/2001 | Belady et al. .............. 361/704 |
| 6,285,550 | B1 | * | 9/2001 | Belady ....................... 361/704 |
| 6,496,370 | B1 | * | 12/2002 | Geusic et al. .............. 361/699 |
| 6,510,053 | B1 | * | 1/2003 | Azar .......................... 361/704 |
| 6,788,537 | B1 | * | 9/2004 | Saita et al. ................ 361/700 |
| 6,937,471 | B1 | * | 8/2005 | Haws et al. ................ 361/699 |
| 7,013,958 | B1 | * | 3/2006 | Garner et al. .......... 165/104.26 |
| 2002/0151195 | A1 | | 10/2002 | DiBene, II et al. |
| 2004/0027802 | A1 | | 2/2004 | Duerbaum et al. |
| 2004/0065111 | A1 | | 4/2004 | Monfarad |
| 2004/0218361 | A1 | * | 11/2004 | Lin et al. .................... 361/695 |

FOREIGN PATENT DOCUMENTS

WO    WO01/65344 A2    9/2001

OTHER PUBLICATIONS

"PCT International Search Report of the International Searching Authority", mailed Aug. 24, 2006, for PCT/US2005/044704, 3 pgs.

* cited by examiner

*Primary Examiner*—Michael Datskovskiy
(74) *Attorney, Agent, or Firm*—Buckley, Maschoff & Talwalkar LLC

(57) ABSTRACT

According to some embodiments, a cooling device may comprise first and second contact surfaces to transfer heat to a cooling medium. The cooling device may further comprise, in some embodiments, a first electrical component coupled to transmit heat to the first contact surface and a second electrical component coupled to transmit heat to the second contact surface.

23 Claims, 8 Drawing Sheets

US 7,149,086 B2

SYSTEMS TO COOL MULTIPLE ELECTRICAL COMPONENTS

BACKGROUND

Electrical devices, such as computers, are comprised of multiple electrical components (e.g., processors, voltage regulators, and/or memory devices). Electrical components typically dissipate unused electrical energy as heat, which may damage the electrical components and/or their surroundings (e.g., other electrical components and/or structural devices such as casings, housings, and/or electrical interconnects). Various means, such as heat sinks and heat pipes, have been utilized to control and/or remove heat from electrical components and their surroundings.

As electrical devices, such as Personal Digital Assistant (PDA) devices and even computer servers, are reduced in size however, space constraints become limiting design factors. Typical heat mitigation devices, for example, take up considerable amounts of room within electrical devices. As these electrical devices increase in processing speed and power, their components will generate even more heat that must be removed. Typical heat mitigation devices may not be suitable for removing adequate amounts of heat from electrical components, particularly where space is a concern.

DETAILED DESCRIPTION

Figure 1:
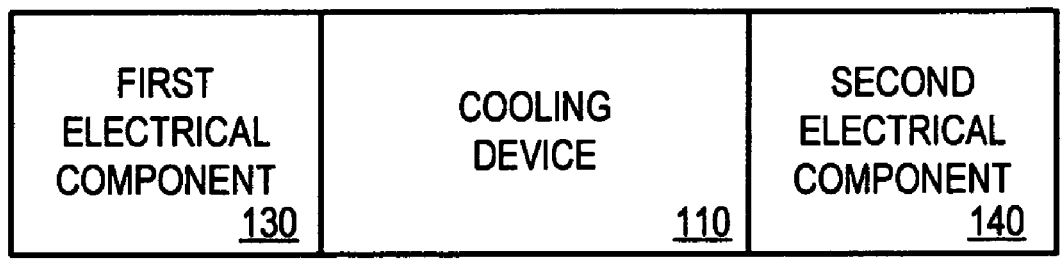
FIG. 1 is a block diagram of a system according to some embodiments.

Referring initially to FIG. 1, a block diagram of a system 100 according to some embodiments is shown. The system 100 may, according to some embodiments, comprise a cooling device 110. The cooling device 110 may include first and second contact surfaces (not shown in FIG. 1) to transfer heat to a cooling medium (not shown). The first contact surface of the cooling device 110 may, for example, be coupled to a first electrical component 130 and the second contact surface may be coupled to a second electrical component 140. In some embodiments, the system 100 may include fewer or more components than are shown in FIG. 1. The various systems described herein are depicted for use in explanation, but not limitation, of described embodiments. Different types, layouts, quantities, and configurations of any of the systems described herein may be used without deviating from the scope of some embodiments.

According to some embodiments, the system 100 may be or include a computer and/or other electrical device. The electrical components 130, 140 may, for example, be any type or configuration of electrical components that are or become known. In some embodiments, either or both of the electrical components 130, 140 may comprise one or more processors, Voltage Regulator Module (VRM) devices, memory devices, and/or other electrical components. The first electrical component 130 may be a microprocessor, for example, and/or the second electrical component 140 may be a VRM device (e.g., that regulates the voltage supplied to the microprocessor 130).

In some embodiments, the cooling device 110 may cool both electrical components 130, 140. The cooling device 110 may, for example, simultaneously remove heat from each of the electrical components 130, 140. According to some embodiments, the cooling device 110 may be coupled to each of the electrical components 130, 140 such that heat from the electrical components 130, 140 may be removed by the cooling device 110. The cooling device 110 may, for example, be situated between the two electrical components 130, 140, and/or may otherwise utilize two or more sides and/or surfaces of the cooling device 110 to remove heat from the electrical components 130, 140. In such a manner, for example, a single cooling device 110 may be utilized to cool multiple electrical components 130, 140.

The cooling device 110 may be or include any type or configuration of cooling device that is or becomes known or practicable. The cooling device 110 may, for example, employ any number of cooling techniques to remove heat from the two electrical components 130, 140. In some embodiments, the cooling device 110 may include, for example, a loop thermosyphon and/or other cooling components and/or devices such as heat sinks, heat pipes, and/or thermo-electrical cooling components. According to some embodiments, the cooling device 110 may be a loop thermosyphon that utilizes two or more sides to cool the two electrical components 130, 140.

Figure 2:
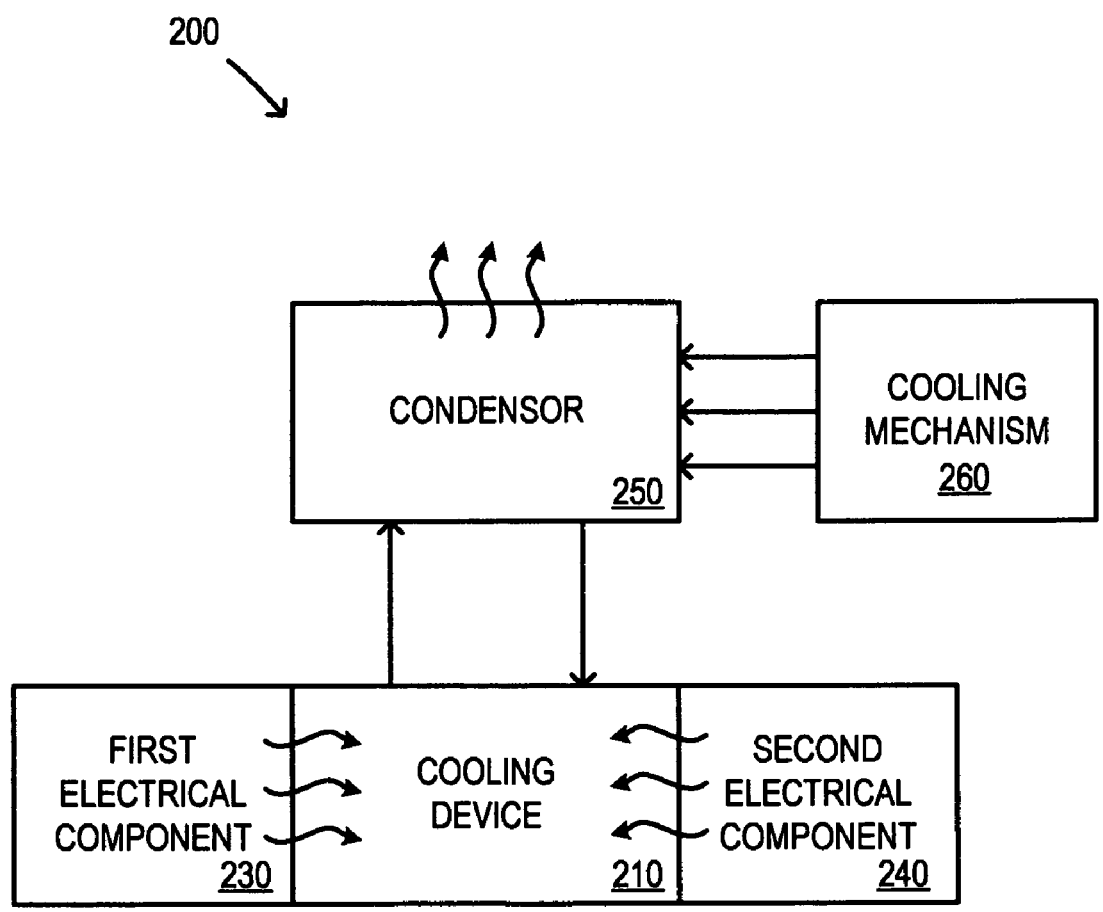
FIG. 2 is a block diagram of a system according to some embodiments.

Referring in more detail to FIG. 2, a block diagram of a system 200 according to some embodiments is shown. In some embodiments, the system 200 may be similar to the system 100 as described in conjunction with FIG. 1. The system 200 may include, according to some embodiments, a cooling device 210, a first electrical component 230, a second electrical component 240, a condenser 250, and/or a cooling mechanism 260. According to some embodiments, the components 210, 230, 240 of the system 200 may be similar in configuration and/or functionality to the similarly-named components described in conjunction with FIG. 1. In some embodiments, fewer or more components than are shown in FIG. 2 may be included in the system 200.

The system 200 may, according to some embodiments, be or include a computer device such as a Personal Computer (PC) or a computer server. The first electrical component 230 may, for example, be or include a microprocessor and/or the second electrical component 240 may be or include a VRM device (and/or a second processor). According to some embodiments, each of the electrical components 230, 240 may generate heat. In some embodiments, the cooling device 210 may receive some or substantially all of the heat generated by the electrical components 230, 240. The cooling device 210 may, for example, comprise two or more contact surfaces (e.g., the sides of the cooling device 210 adjacent to the electrical components 230, 240) to receive heat from the electrical components 230, 240. In some embodiments, the heat may be received via conduction (e.g., conduction through air, another fluid, and/or the contact surfaces).

For example, the electrical components 230, 240 may generate heat (e.g., represented by the wavy directional lines in FIG. 2) that is conducted through the contact surfaces of the cooling device 210, which may for example, be coupled, attached, and/or adjacent to the electrical components 230, 240. The contact surfaces may, for example, be physically and/or thermally coupled to receive heat from the electrical components 230, 240. In some embodiments, the cooling device 210 may be or include an evaporation chamber that receives the heat from the contact surfaces. Inside the evaporation chamber (e.g., in an evaporation cavity), a cooling medium such as a working fluid (e.g., water) may be boiled and/or otherwise undergo a phase change (e.g., from a liquid to a gas or vapor) in response to the received heat. According to some embodiments, the heated and/or phase-changed working fluid may proceed to the condenser 250 (e.g., via a conduit and/or other path).

The condenser 250 may, for example, be or include a device configured to remove heat from the working fluid and/or otherwise change the working fluid back to the original phase (e.g., a liquid). In some embodiments, the condenser 250 may be situated in a location cooler than that of the cooling device 210 (and/or the evaporation chamber thereof). The condenser 250 may, for example, be subject to cooling from the cooling mechanism 260. According to some embodiments, the cooling mechanism 260 may be or include any type or configuration of cooling object, device, and/or system that is or becomes known or practicable. The cooling mechanism 260 may, for example, be a cool (e.g., relative to the temperature of the heated and/or phase-changed working fluid) location, a thermo-electric cooling device, a cooling surface, a heat sink, and/or a fan.

In some embodiments, the condenser 250 and/or the cooling mechanism 260 may cause the working fluid to be cooled and/or to revert to the original phase. The working fluid may then, for example, proceed back to the cooling device 210 (e.g., via a conduit and/or other path). Once the cooled working fluid is returned to the cooling device 210, the working fluid may again be heated and/or undergo phase change to continue the cooling of the electrical components 230, 240. The cooling device 210 and/or the condenser 250 may, for example, comprise a single loop thermosyphon configured to cool both electrical components 230, 240. Typical cooling solutions, in contrast, require multiple cooling devices 210 and/or other complicated and/or expensive cooling strategies to cool both of the electrical components 230, 240.

Figure 3:
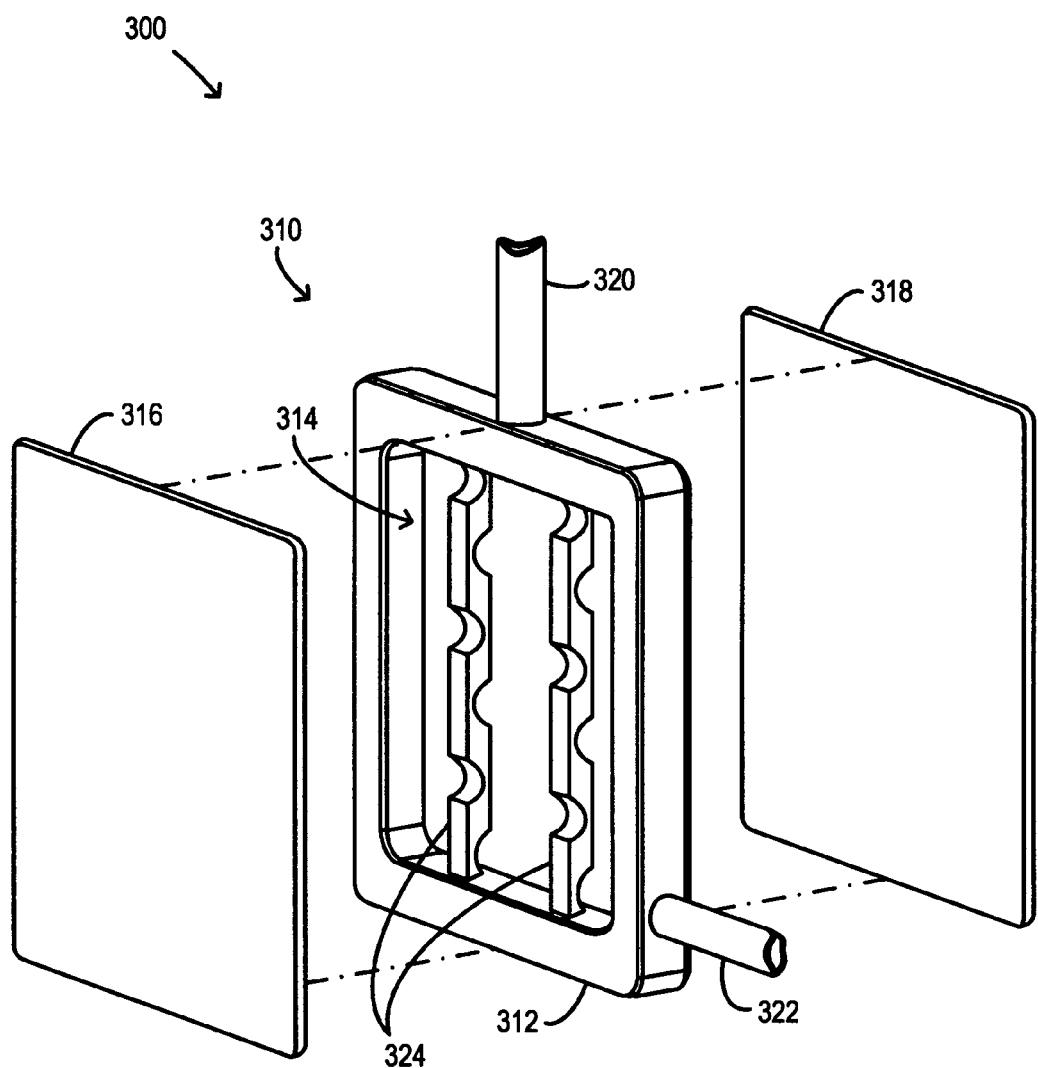
FIG. 3 is a perspective assembly view of a system according to some embodiments.

Turning now to FIG. 3, a perspective assembly view of a system 300 according to some embodiments is shown. In some embodiments, the system 300 may be similar to the systems 100, 200 as described in conjunction with any of FIG. 1 and/or FIG. 2. The system 300 may include, according to some embodiments, a cooling device 310. The cooling device 310 may comprise, for example, an evaporation chamber 312, an evaporation cavity 314, a first contact surface 316, and/or a second contact surface 318. In some embodiments, the cooling device 310 may further comprise a first conduit 320, a second conduit 322, and/or an anti-crush device 324. According to some embodiments, the components 310, 312, 316, 318, 320, 322 of the system 300 may be similar in configuration and/or functionality to the similarly-named components described in conjunction with any of FIG. 1 and/or FIG. 2. In some embodiments, fewer or more components than are shown in FIG. 3 may be included in the system 300.

In some embodiments, the cooling device 310 may be capable of cooling two or more electrical components (not shown in FIG. 3). The first contact surface 316 may be coupled to receive heat from one electrical component, for example, and/or the second contact surface 318 may be coupled to receive heat from another electrical component. The contact surfaces 316, 318 may be constructed, according to some embodiments, of one or more materials suitable for transferring heat. The contact surfaces 316, 318 may, for example, be constructed of copper and/or substantially of copper, to promote heat transfer from the electrical devices to the evaporation chamber 312.

According to some embodiments, the contact surfaces 316, 318 may be attached, affixed, and/or otherwise coupled to the evaporation chamber 312. As shown in FIG. 3, for example, the contact surfaces 316, 318 may comprise opposite sides of the evaporation chamber 312. The attachment of the contact surfaces 316, 318 to the evaporation chamber 312 may, for example, define the enclosed evaporation cavity 314. In some embodiments, the evaporation cavity 314 may contain a cooling medium that may comprise, for example, one or more working fluids. The heat transferred into the evaporation cavity 314 from the contact surfaces 316, 318 may, according to some embodiments, heat the working fluid.

In some embodiments, the evaporation cavity 314 may be established at a pressure that facilitates boiling and/or phase change of the working fluid. The pressure inside the evaporation cavity 314 may, for example, be established such that the boiling point of the working fluid is lower than the operating temperature expected of the electrical components. In other words, the pressure may be set so that the heat received from the electrical components (e.g., and via the contact surfaces 316, 318) causes the working fluid to boil and/or undergo a phase change. The working fluid may then, for example, travel out of the evaporation cavity 314 via the first conduit 320. The first conduit 320 may, according to some embodiments, be or include a tube, pipe, and/or other path for transporting and/or evacuating the heated working fluid. In some embodiments, the heated working fluid may be delivered to a condenser such as the condenser 250 described in conjunction with FIG. 2.

According to some embodiments, the working fluid may be cooled, condensed, and/or may otherwise be converted back to the original phase. The working fluid may then, for example, travel back to the evaporation cavity 314 via the second conduit 322. In some embodiments, the first conduit 320 may be oriented and/or configured to facilitate the evacuation of gas, vapor, and/or steam from the evaporation cavity 314. The second conduit 322 may also or alternatively be oriented and/or configured to facilitate the return of liquid to the evaporation cavity 314. In the case that the working fluid is water, for example, the first conduit may evacuate water vapor from the evaporation cavity 314, while the second conduit may return liquid water to the evaporation cavity 314.

In some embodiments, such as in the case that the evaporation cavity 314 is maintained at a particular pressure to facilitate phase change of the working fluid, the evaporation chamber 312 may comprise the anti-crush device 324. The anti-crush device 324 may, for example, be a device and/or object that substantially prevents the collapse of the evaporation chamber 312. In the case that the evaporation cavity 314 is set at a lower pressure than that of the environment outside of the evaporation cavity 314, for example, the anti-crush device 324 may substantially prevent the pressure differential from damaging, collapsing, imploding, and/or otherwise compromising the evaporation chamber 312.

The evaporation chamber 312 (and/or the contact surfaces 316, 318) and/or the evaporation cavity 314 may, according to some embodiments, also or alternatively comprise one or more boiling enhancements (not shown). The contact surfaces 316, 318 and/or the inner surfaces of the evaporation chamber 312 (e.g., the structural boundaries of the evaporation cavity 314) may, for example, comprise sintered coarse powder, felted strand structures, milled grooves, roughened surfaces, wick surfaces, other enhancements, and/or any combination thereof. The boiling enhancements, in some embodiments, may facilitate the working fluid phase change such that even at relatively low temperatures (e.g., of the electrical components), the cooling device 310 may be capable of removing heat from the electrical components.

Figure 4:
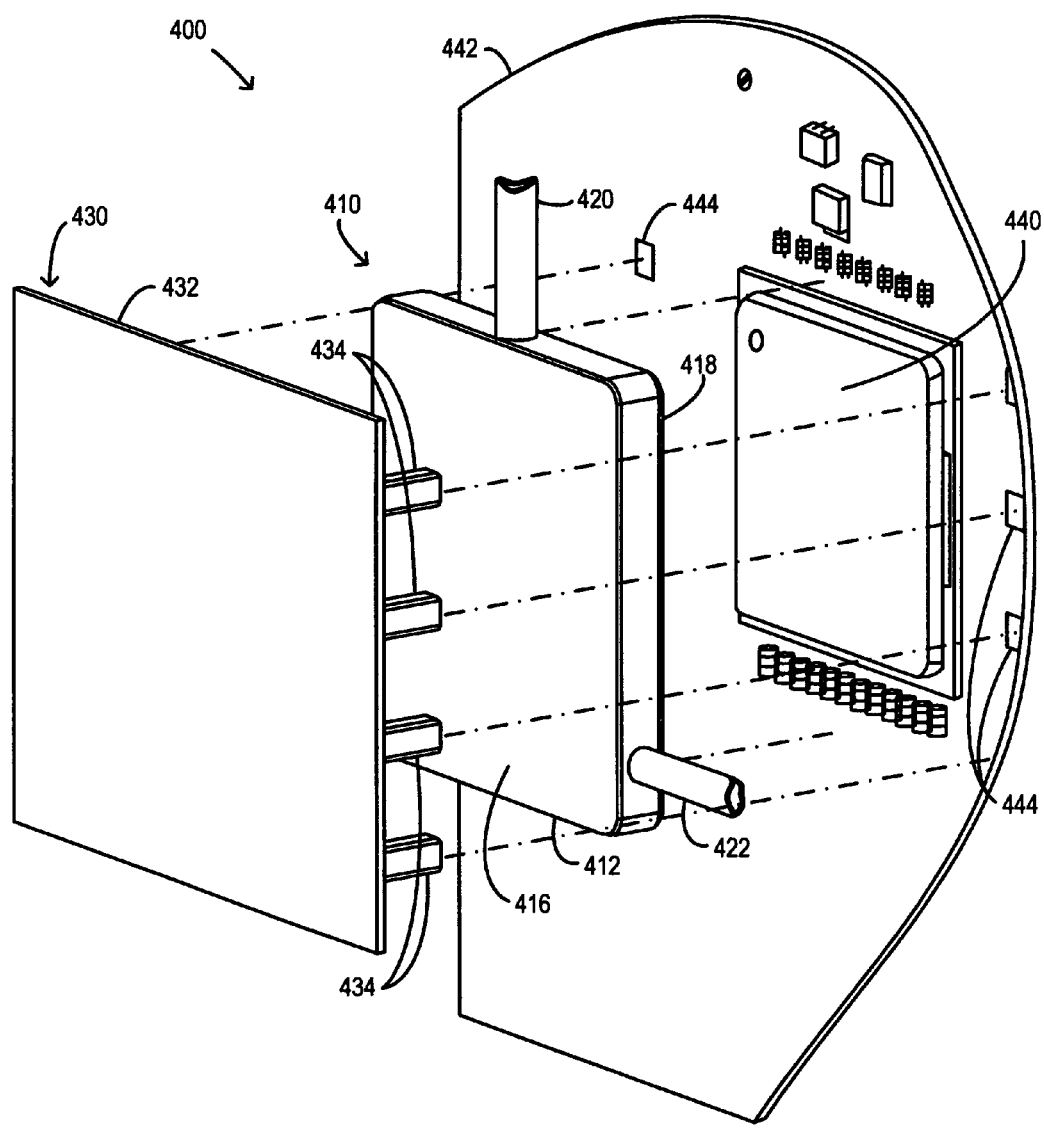
FIG. 4 is a perspective assembly view of a system according to some embodiments.

Referring now to FIG. 4, a perspective assembly view of a system 400 according to some embodiments is shown. In some embodiments, the system 400 may be similar to the systems 100, 200, 300 as described in conjunction with any of FIG. 1, FIG. 2, and/or FIG. 3. The system 400 may include, according to some embodiments, a cooling device 410. The cooling device 410 may comprise, for example, an evaporation chamber 412, a first contact surface 416, and/or a second contact surface 418. In some embodiments, the cooling device 410 may further comprise a first conduit 420, and/or a second conduit 422. The system 400 may also or alternatively comprise a first electrical component 430, a daughter board 432, electrical interconnects 434, and/or a second electrical component 440.

The first electrical component 430 may, for example, be disposed underneath and/or on the back side of the daughter board 432 (e.g., the side of the daughter board 432 closest to the cooling device 410. In some embodiments, the system 400 may also comprise a motherboard 442 and/or mating surfaces 444. According to some embodiments, the components 410, 412, 416, 418, 420, 422, 430, 440 of the system 400 may be similar in configuration and/or functionality to the similarly-named components described in conjunction with any of FIG. 1, FIG. 2, and/or FIG. 3. In some embodiments, fewer or more components than are shown in FIG. 4 may be included in the system 400.

According to some embodiments, the first electrical component 430 may be or include a VRM device that regulates the supply of power to the second electrical component 440. The second electrical component 440 may, for example, be or include a processor. In some embodiments (such as shown in FIG. 4), the first electrical component 430 may be situated on and/or otherwise comprise a daughter board 432 that interfaces with the motherboard 442 via the electrical interconnects 434. In some embodiments, the electrical interconnects 434 may couple (e.g., mechanically and/or electrically) to the motherboard 442 via the mating surfaces 444. According to some embodiments, the electrical interconnects 434 may facilitate the cooling of the electrical components 430, 440.

The electrical interconnects 434 may, for example, be configured as standoffs and/or interconnect posts, permitting the cooling device 410 to be positioned between the first electrical component 430 (and/or the associated daughter board 432) and the second electrical component 440 (and/or the motherboard 442). In the case that the first contact surface 416 of the cooling device 410 is coupled to the first electrical component 430 and the second contact surface 418 is coupled to the second electrical component 440, for example, the cooling device 410 may be positioned between the electrical components 430, 440 to simultaneously cool both electrical components 430, 440. Such a configuration may, for example, reduce space constraints on the motherboard 442 by allowing the second electrical component 430 to be moved off of the motherboard 442 (which would be the typical placement of the second electrical component 430) and onto the daughterboard 432. According to some embodiments, space may also or alternatively be saved within the system 400 by cooling both electrical components 430, 440 with the single cooling device 410.

In some embodiments, the system 400 may be assembled such that the first and second contact surfaces 416, 418 of the cooling device 410 are in contact with the first and second electrical components 430, 440, respectively. Heat generated by the electrical components 430, 440 may, for example, be conducted through the contact surfaces 416, 418 and into the evaporation chamber 412 of the cooling device 410. The heat transferred from the electrical components 430, 440 to the evaporation chamber 412 may, according to some embodiments, cause a phase change in a cooling medium such as a working fluid within the evaporation chamber 412. The working fluid may, for example, be converted to a gas that is evacuated from the evaporation chamber 412 via the first conduit 420. The working fluid may then, according to some embodiments, be converted back into a liquid (e.g., by a condenser and/or other device and/or mechanism), and returned to the evaporation chamber 412 via the second conduit 422. In such a manner, for example, the cooling device 410 may perform as a loop thermosyphon that is capable of removing heat from both electrical components 430, 440.

Figure 5:
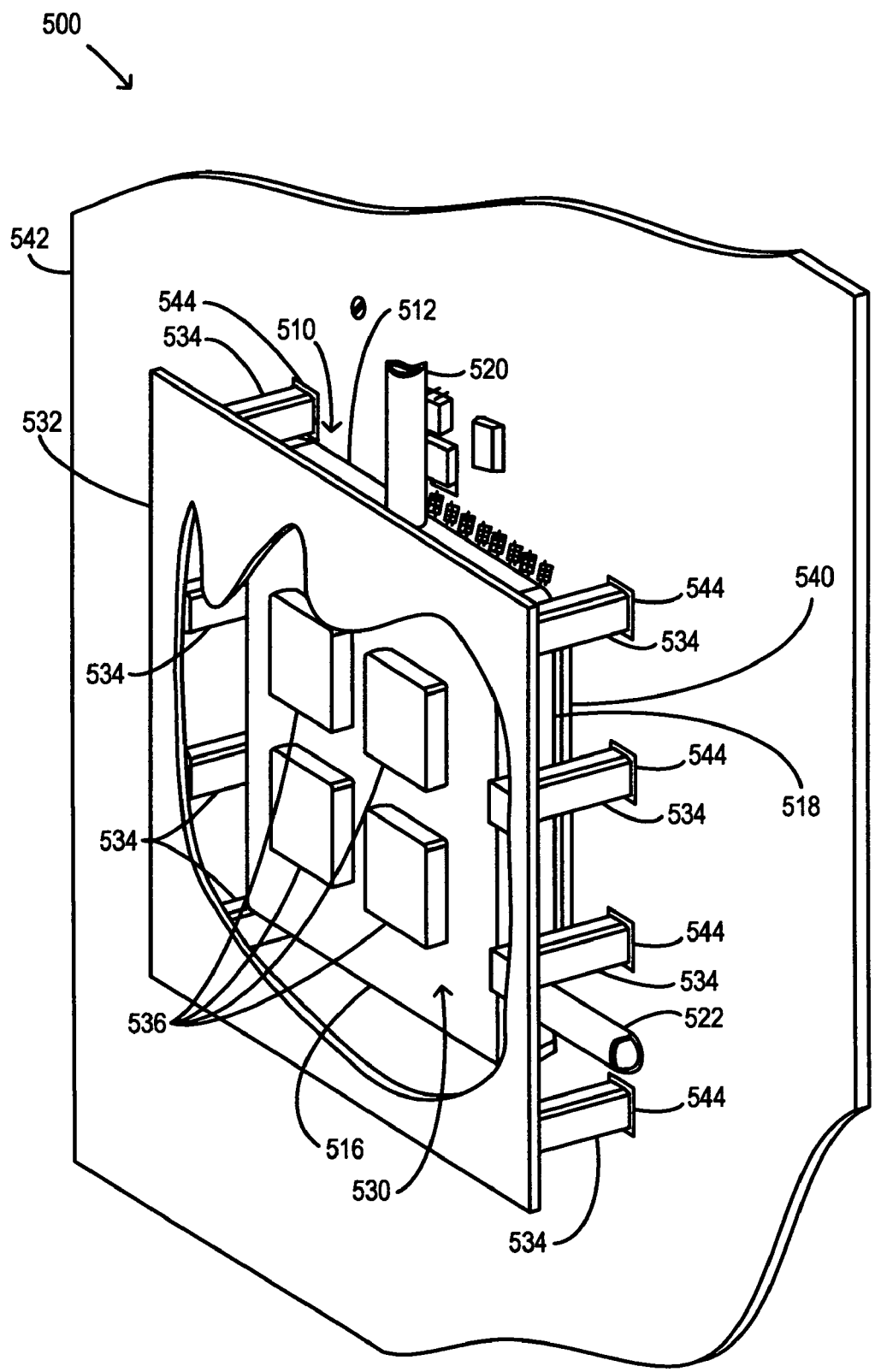
FIG. 5 is a perspective cut-away view of a system according to some embodiments.

Turning to FIG. 5, a perspective cut-away view of a system 500 according to some embodiments is shown. In some embodiments, the system 500 may be similar to the systems 100, 200, 300, 400 as described in conjunction with any of FIG. 1, FIG. 2, FIG. 3, and/or FIG. 4. The system 500 may include, according to some embodiments, a cooling device 510. The cooling device 510 may comprise, for example, an evaporation chamber 512, a first contact surface 516, a second contact surface 518, a first conduit 520, and/or a second conduit 522. The system 500 may also or alternatively comprise a first electrical component 530, a daughter board 532, electrical interconnects 534, one or more electrical devices 536, and/or a second electrical component 540. In some embodiments, the system 500 may also comprise a motherboard 542 and/or mating surfaces 544. According to some embodiments, the components 510, 512, 516, 518, 520, 522, 530, 532, 534, 540, 542, 544 of the system 500 may be similar in configuration and/or functionality to the similarly-named components described in conjunction with any of FIG. 1, FIG. 2, FIG. 3, and/or FIG. 4. In some embodiments, fewer or more components than are shown in FIG. 5 may be included in the system 500.

According to some embodiments, the cooling device 510 may be or include a loop thermosyphon that is capable of receiving heat from the electrical components 530, 540 via the contact surfaces 516, 518 located on opposite sides of the evaporation chamber 512. The cooling device 510 may, for example, be positioned between the electrical components 530, 540. In other words, as shown in FIG. 5, the cooling device 510 may be sandwiched between the electrical components 530, 540 to receive heat (e.g., simultaneously) from both electrical components 530, 540. Utilizing the single cooling device 510 to cool both electrical components 530, 540 may, according to some embodiments, reduce space constraints within the system 500.

For example, the first electrical component 530 may comprise one or more electrical devices 536 (e.g., processors, VRM devices, memory devices, transformers, capacitors, diodes, and/or other electrical or electronic components) that may typically be situated on the motherboard 542 adjacent to the second electrical component 540. In typical systems, the first and second electrical components 530, 540 may need to be cooled by separate cooling devices 510. In typical systems where a single cooling device 510 may be utilized to cool the electrical components 530, 540, the co-planarity (i.e., assembly) tolerances required of the cooling solution may be difficult to maintain and/or costly to implement. In the typical case that the electrical devices 536 of the first electrical component 530 are located on the motherboard 542, for example, a shared cooling solution may require intricate and/or precise assembly and/or manufacturing tolerances to maintain the thermal and/or physical couplings necessary for the cooling solution to function in a shared manner.

According to some embodiments, the use of the dual-sided cooling device 510 to cool both electrical components 530, 540 (and/or the electrical devices 536) allows the electrical devices 536 of the first cooling device 530 to be moved off of the motherboard 542 and located on the daughter board 532. In such a manner, for example, space may be saved on the motherboard 542. Further, situating the electrical devices 536 on the daughter board 532 may permit and/or facilitate the shared cooling solution of some embodiments. For example, the electrical interconnects 534 may comprise spring and/or other biasing elements (not shown) that compress the cooling device 510 between the electrical components 530, 540, reducing the requirement for stringent assembly tolerances. According to some embodiments, the assembly tolerances may also or alternatively be easily and/or cheaply maintained by utilizing a standard clip and/or spring-type mounting assembly (not shown) between the two independent circuit boards 532, 542.

Figure 6:
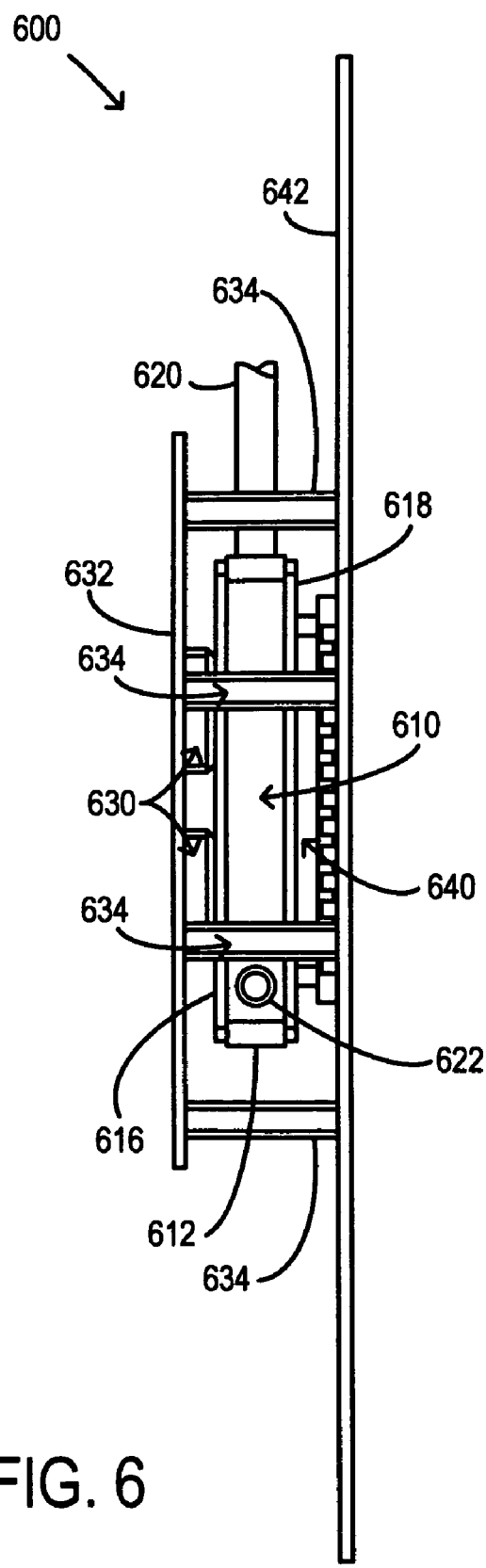
FIG. 6 is a side view of a system according to some embodiments.

Referring now to FIG. 6, a side view of a system 600 according to some embodiments is shown. In some embodiments, the system 600 may be similar to the systems 100, 200, 300, 400, 500 as described in conjunction with any of FIG. 1, FIG. 2, FIG. 3, FIG. 4, and/or FIG. 5. The system 600 may include, according to some embodiments, a cooling device 610. The cooling device 610 may comprise, for example, an evaporation chamber 612, a first contact surface 616, a second contact surface 618, a first conduit 620, and/or a second conduit 622. The system 600 may also or alternatively comprise a first electrical component 630, a daughter board 632, electrical interconnects 634, a second electrical component 640, and/or a motherboard 642. According to some embodiments, the components 610, 612, 616, 618, 620, 622, 630, 632, 634, 640, 642 of the system 600 may be similar in configuration and/or functionality to the similarly-named components described in conjunction with any of FIG. 1, FIG. 2, FIG. 3, FIG. 4, and/or FIG. 5. In some embodiments, fewer or more components than are shown in FIG. 6 may be included in the system 600.

According to some embodiments, the system 600 may be a side-view of any of the systems 100, 200, 300, 400, 500 described herein. The system 600 may, for example, be a side and/or edge view of a computer motherboard 642 comprising first and second electrical components 630, 640. The first and second electrical components 630, 640 may, in some embodiments, both be cooled by the cooling device 610. As shown in FIG. 6, for example, the first contact surface 616 of the cooling device 610 may be coupled to the first electrical component 630 and/or the second contact surface 618 may be coupled to the second electrical component 640.

In some embodiments, the daughter board 632 may be attached to the motherboard 642 (e.g., electrically and/or physically) by the electrical interconnects 634. The electrical interconnects 634 may, for example, cause the daughter board 632 and/or the first electrical component 630 to force the cooling device 610 between the electrical components 630, 640. In some embodiments, such as where a clip and/or spring-type mounting assembly (not shown) is utilized to position the cooling device 610 between the electrical components 630, 640, either or both of the contact surfaces 616, 618 of the cooling device 610 may not be physically coupled and/or entirely physically coupled to either or both of the electrical components 630, 640. In some embodiments in other words, an air space and/or another device or component (e.g., a spacer and/or a film) may physically separate the contact surfaces 616, 618 from the electrical components 630, 640. The contact surfaces 616, 618 may, for example, be coupled to receive heat from (e.g., thermally coupled to) the electrical components 630, 640, without physically contacting the electrical components 630, 640.

In some embodiments, the contact surfaces 616, 618 may not be entirely and/or continuously coupled to the electrical components 630, 640. As shown in FIG. 6 for example, the first electrical component 630 may comprise more than one part, portion, and/or segment. Each of the portions of the first electrical component 630 may, according to some embodiments, be coupled to the first contact surface 616, while portions and/or areas of the first contact surface 616 may not be coupled any electrical components 630, 640. Areas of either or both contact surfaces 616, 618 may, for example, be exposed to an air space and/or otherwise may not be coupled and/or continuously coupled to other devices or components.

Figure 7:
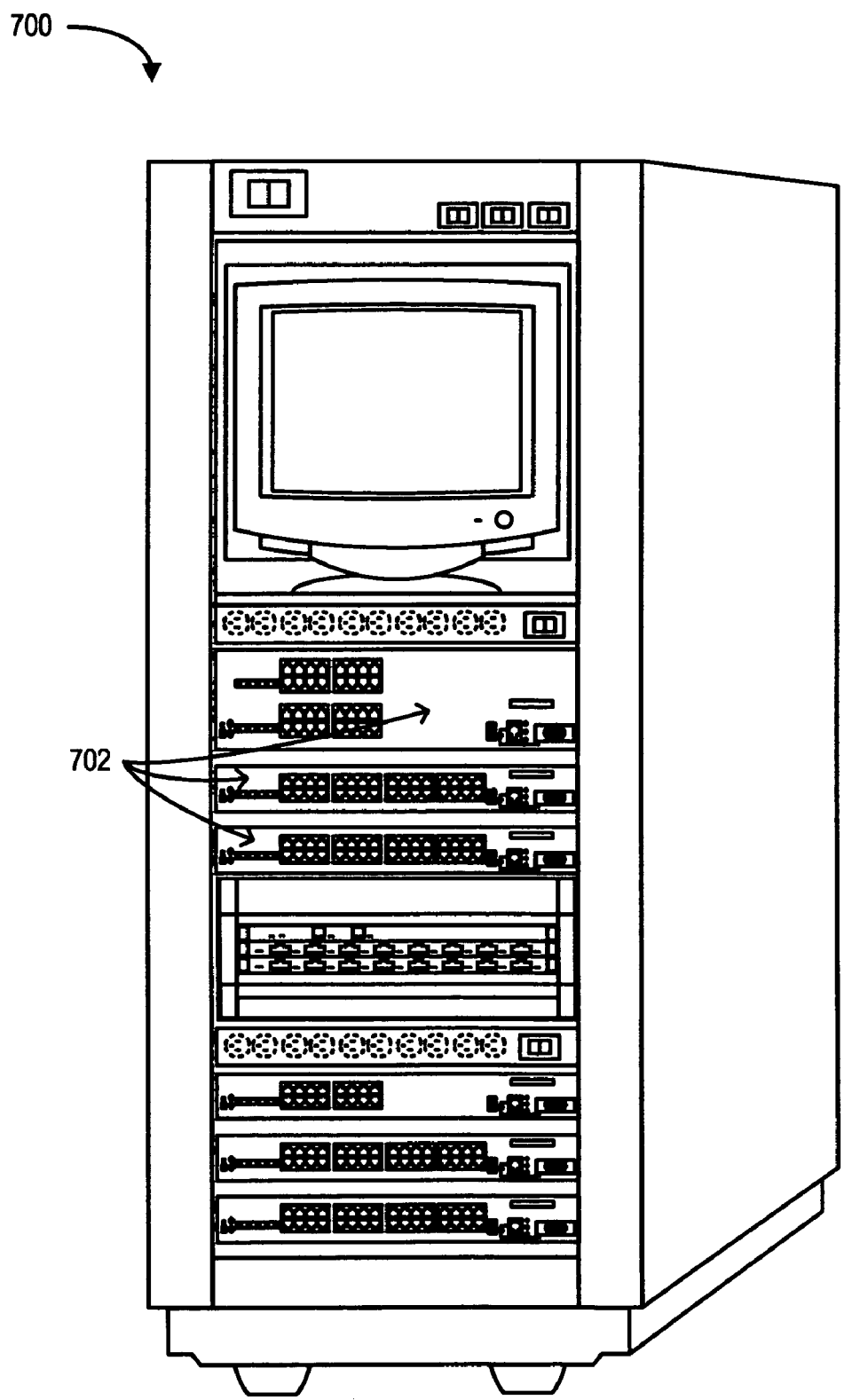
FIG. 7 is a perspective view of a system according to some embodiments.

Turning to FIG. 7, a perspective view of a system 700 according to some embodiments is shown. In some embodiments, the system 700 may comprise the systems 100, 200, 300, 400, 500, 600 as described in conjunction with any of FIG. 1, FIG. 2, FIG. 3, FIG. 4, FIG. 5, and/or FIG. 6. The system 700 may include, according to some embodiments, one or more servers 702. In some embodiments, any or all of the servers 702 may comprise multiple electrical components cooled by a single cooling device, as described in conjunction with any of FIG. 1, FIG. 2, FIG. 3, FIG. 4, FIG. 5, and/or FIG. 6, herein. According to some embodiments, the utilization of a single cooling device such as a dual-sided loop thermosyphon may save space within the servers 702. The servers 702 may, for example, by blade servers and/or other small form factor (such as "4U" form factor) servers comprising one or more space-saving cooling solutions as described herein. In some embodiments, portions of the cooling solutions may be shared amongst and/or between the servers 702. In the case that dual-sided loop thermosyphons are included within the servers 702, for example, the servers 702 may share condensers and/or cooling mechanisms (e.g., fans) that operate as parts of the thermal loop.

Figure 8:
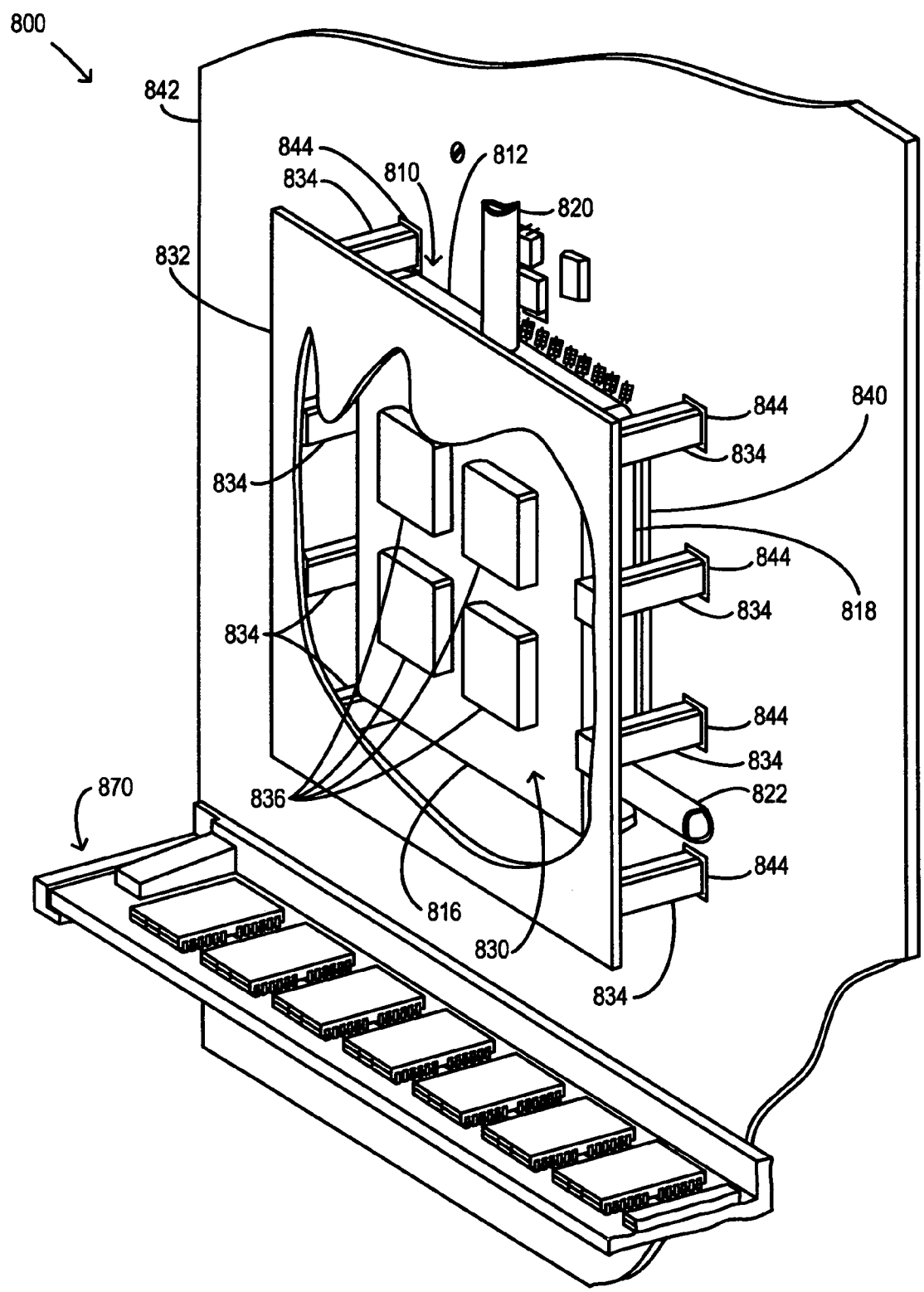
FIG. 8 is a perspective cut-away view of a system according to some embodiments.

Referring now to FIG. 8, a perspective cut-away view of a system 800 according to some embodiments is shown. In some embodiments, the system 800 may be similar to the systems 100, 200, 300, 400, 500, 600 as described in conjunction with any of FIG. 1, FIG. 2, FIG. 3, FIG. 4, FIG. 5, FIG. 6, and/or FIG. 7. The system 800 may include, according to some embodiments, a cooling device 810. The cooling device 810 may comprise, for example, an evaporation chamber 812, a first contact surface 816, a second contact surface 818, a first conduit 820, and/or a second conduit 822. The system 800 may also or alternatively comprise a first electrical component 830, a daughter board 832, electrical interconnects 834, one or more electrical devices 836, and/or a second electrical component 840. In some embodiments, the system 800 may also comprise a motherboard 842 and/or mating surfaces 844. The system 800 may also or alternatively comprise a memory device 870. According to some embodiments, the components 810, 812, 816, 818, 820, 822, 830, 832, 834, 840, 842, 844 of the system 800 may be similar in configuration and/or functionality to the similarly-named components described in conjunction with any of FIG. 1, FIG. 2, FIG. 3, FIG. 4, FIG. 5, FIG. 6, and/or FIG. 7. In some embodiments, fewer or more components than are shown in FIG. 8 may be included in the system 800.

The system 800 may, according to some embodiments, be or include a computer device such as a Personal Computer (PC) or a blade server such as an Intel® Server Compute Blade SBXL52. The first electrical component 830 may, for example, be a VRM device such as a VRM device configured in accordance with the "Voltage Regulator Module (VRM) and Enterprise Voltage Regulator-Down (EVRD)—Design Guidelines", version 10.1, published by Intel® Corporation in June 2004, and/or the second electrical component 240 may be a microprocessor such as an Intel® Xeon™ Processor MP. In some embodiments, the VRM device 830 may regulate the voltage supplied to the processor 840 and/or other processors (not shown).

The processor 840 may be or include any number of processors, which may be include any type or configuration of processor, microprocessor, and/or micro-engine that is or becomes known or available. The memory 870 may be or include, according to some embodiments, one or more magnetic storage devices, such as hard disks, one or more optical storage devices, and/or solid state storage. The memory 870 may store, for example, applications, programs, procedures, and/or modules that store instructions to be executed by the processor 840. The memory 870 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

In some embodiments, the cooling device 810 may comprise an evaporation chamber having contact surfaces 816, 818 on two or more sides (such as the opposing sides shown in FIG. 8). The contact surfaces 816, 818 may, as described elsewhere herein, receive heat from the VRM device 830 (and/or the electrical devices 836 associated with and/or comprising the VRM device 830) and the processor 840. In some embodiments, the use of two sides of the single cooling device 810 to cool both electrical components 830, 840 may reduce space constraints within the blade server 800 and/or may reduce manufacturing and/or assembly costs associated with cooling the multiple electrical components 830, 840.

The several embodiments described herein are solely for the purpose of illustration. Other embodiments may be practiced with modifications and alterations limited only by the claims.

What is claimed is:

1. An apparatus, comprising:
   a first printed circuit board;
   a second printed circuit board coupled to the first printed circuit board;
   a first electrical component coupled to the first printed circuit board;
   a second electrical component coupled to the second printed circuit board; and
   a loop thermosyphon coupled to remove heat from each of the first and second electrical components.

2. The apparatus of claim 1, wherein at least one of the first and second electrical components comprises at least one of a processor, a memory, a printed circuit board, a power supply, a voltage regulator, or an electrical path.

3. The apparatus of claim 1, further comprising a fluid to receive the heat, the apparatus further comprising:
   a first conduit coupled to the thermosyphon, wherein the first conduit is to transmit the fluid to the loop thermosyphon; and
   a second conduit coupled to the loop thermosyphon, wherein the second conduit is to evacuate the fluid from the loop thermosyphon.

4. The apparatus of claim 3, wherein the first conduit is to transmit the fluid to the loop thermosyphon in a liquid state, and the second conduit is to evacuate the fluid in a gaseous state.

5. The apparatus of claim 4, further comprising:
   a condenser to receive the fluid from the second conduit in the gaseous state and to convert the fluid to the liquid state.

6. The apparatus of claim 5, further comprising:
   a cooling mechanism to facilitate the removal of heat from the condenser.

7. The apparatus of claim 3, wherein the fluid comprises water.

8. The apparatus of claim 1, wherein the first electrical component comprises a processor and the second electrical component comprises a voltage regulator.

9. The apparatus of claim 1, wherein the first printed circuit board comprises a motherboard and the second printed circuit board comprises a daughterboard.

10. The apparatus of claim 1, wherein the second printed circuit board is coupled to the first printed circuit board via one or more interconnect posts.

11. The apparatus of claim 1, wherein the loop thermosyphon comprises an evaporation chamber that is situated between the first and second circuit boards.

12. The apparatus of claim 1, wherein the loop thermosyphon comprises an evaporation chamber that comprises:
    a first side coupled to remove heat from the first electrical component; and
    a second side coupled to remove heat from the second electrical component.

13. The apparatus of claim 12, wherein the first and second sides of the evaporation chamber are opposite sides of the evaporation chamber.

14. The apparatus of claim 12, wherein the evaporation chamber defines a cavity containing a cooling medium, and wherein the cavity is pressurized to a first pressure.

15. The apparatus of claim 14, wherein the first pressure facilitates a conversion of the cooling medium from a liquid state to a gaseous state.

16. The apparatus of claim 14, wherein the first pressure is different than a second pressure outside of the evaporation chamber.

17. The apparatus of claim 16, wherein the evaporation chamber further comprises:
    a structural device to substantially prevent the difference between the first and second pressures from compromising the evaporation chamber.

18. The apparatus of claim 12 wherein the evaporation chamber further comprises:
    at least one boiling enhancement that facilitates a conversion of a cooling medium from a liquid state to a gaseous state.

19. The apparatus of claim 18, wherein the at least one boiling enhancement comprises at least one of a roughened surface within the evaporation chamber or a wick surface within the evaporation chamber.

20. A system, comprising:
- a first printed circuit board;
- a second printed circuit board coupled to the first printed circuit board;
- a processor coupled to the first printed circuit board;
- an electrical component coupled to the second printed circuit board;
- a loop thermosyphon coupled to remove heat from each of the processor and the electrical component; and
- a double data rate memory coupled to the processor, wherein the memory is to store instructions to be executed by the processor.

21. The system of claim 20, wherein the processor and the electrical component are to transmit heat to the loop thermosyphon.

22. The system of claim 20, wherein the electrical component comprises a voltage regulator.

23. The system of claim 20, wherein the system is a blade server.

* * * * *